US012580374B2

(12) United States Patent　　　(10) Patent No.: US 12,580,374 B2
Jin et al.　　　　　　　　　　　　(45) Date of Patent:　Mar. 17, 2026

(54) HEAT DISSIPATION BOLT

(71) Applicant: Suzhou Littelfuse OVS Co., Ltd., Suzhou (CN)

(72) Inventors: Edward Jin, Suzhou (CN); Du Cheng, Suzhou (CN); Sunny Pan, Suzhou (CN)

(73) Assignee: Suzhou Littlefuse OVS Co., Ltd., Suzhou (CN)

( * ) Notice: Subject to any disclaimer, the term of this patent is extended or adjusted under 35 U.S.C. 154(b) by 579 days.

(21) Appl. No.: 18/121,369

(22) Filed: Mar. 14, 2023

(65) Prior Publication Data

US 2023/0327418 A1　　Oct. 12, 2023

(30) Foreign Application Priority Data

Mar. 22, 2022　(CN) .......................... 202210287909.4

(51) Int. Cl.
| | |
|---|---|
| *F16B 35/00* | (2006.01) |
| *H02B 1/20* | (2006.01) |
| *H02G 5/10* | (2006.01) |
| *H05K 7/20* | (2006.01) |

(52) U.S. Cl.
CPC .............. *H02G 5/10* (2013.01); *F16B 35/00* (2013.01); *H02B 1/20* (2013.01); *H05K 7/20445* (2013.01)

(58) Field of Classification Search
CPC ....... B60R 16/0238; F16B 35/00; H02B 1/20; H02G 5/10; H05K 7/026; H05K 7/14329; H05K 7/20445; H05K 7/209; H05K 7/20
USPC .......................................... 429/120; 361/775
See application file for complete search history.

(56) References Cited

U.S. PATENT DOCUMENTS

| | | | | |
|---|---|---|---|---|
| 5,656,915 | A * | 8/1997 | Eaves ................... | H02J 7/0014 320/120 |
| 2022/0049738 | A1* | 2/2022 | Tokumoto ............... | F16B 39/34 |

FOREIGN PATENT DOCUMENTS

| | | | | |
|---|---|---|---|---|
| JP | 2019192417 A | * | 10/2019 | ............. Y02E 60/10 |
| WO | WO-8911725 A1 | * | 11/1989 | ............. H01H 11/04 |

* cited by examiner

*Primary Examiner* — Timothy J Thompson
*Assistant Examiner* — Guillermo J Egoavil
(74) *Attorney, Agent, or Firm* — KDW Firm PLLC

(57) ABSTRACT

A power distribution unit includes a fuse, a relay, a busbar, and a heat dissipation bolt. The fuse and the relay each have one terminal. The busbar is located between the fuse and the relay and connects to the two terminals. The heat dissipation bolt connects the busbar to a housing of the power distribution unit and includes two threaded bolts, one going through the busbar and the other going through the housing.

18 Claims, 9 Drawing Sheets

200

300

HEAT DISSIPATION BOLT

FIELD OF THE DISCLOSURE

Embodiments of the present disclosure relate to power distribution units and, more particularly, to heat distribution within a power distribution unit.

BACKGROUND

Power distribution units (PDUs), also known as power distribution modules, provide applications with centralized power distribution. PDUs are installed into applications to ensure circuits are protected, controlled, and/or sensed. PDUs typically consist of fuses, relays, circuit breakers, current sensing components, and combinations thereof. The electrical bus of the PDU may consist of one or more busbars, a printed circuit board assembly (PCBA), or a hybrid of the two. PDUs may be used in harsh environments, and thus may be designed for ingress protection, mechanical shock, and vibration, and sealing of the connectors.

Once connected to a power source, the components within the PDU generate heat, with high voltage and high current PDUs being of particular concern. Heat distribution within the busbars of the PDU may be uneven, for example. Busbars disposed between two heat-generating devices, such as a fuse and a relay, may be unable to dissipate the heat quickly enough. In addition to the resulting thermal issue, the uneven heat distribution may affect the performance of the fuses and relays within the PDU.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a power distribution unit in accordance with the present disclosure may include a fuse, a relay, a busbar, and a heat dissipation bolt. The fuse and the relay each have one terminal. The busbar is located between the fuse and the relay and connects to the two terminals. The heat dissipation bolt connects the busbar to a housing of the power distribution unit and includes two threaded bolts, one going through the busbar and the other going through the housing.

Another exemplary embodiment of a power distribution unit in accordance with the present disclosure may include a fuse, a relay, an electrical bus, a support grid, and a heat dissipation bolt within a housing. The fuse and the housing each have two terminals. The electrical bus has three busbars, the first busbar connected to a first terminal of the fuse, the second busbar connected between a second terminal of the fuse and a first terminal of the relay, and the third busbar connected to the second terminal of the relay. The support grid provides physical support to the fuse, the relay, and the electrical bus. The heat dissipation bolt has two bolts and a body and is perpendicular to the second busbar.

DETAILED DESCRIPTION

A heat dissipation bolt is disposed between an isolated busbar of a power distribution unit (PDU) and the housing of the unit. The isolated busbar is located between two fuses, a fuse and a relay, two relays, or between two other heat-generating devices of the PDU. The heat dissipation bolt is bolted at one end through the busbar and at an opposing end through the housing. A ceramic body in the middle of the heat dissipation bolt ensures that current does not pass through the heat dissipation bolt. In addition to providing a path for the efficient transfer of heat from the isolated busbar, the heat dissipation bolt also provides physical support to the isolated busbar.

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components, each with respect to the geometry and orientation of other features and components appearing in the perspective, exploded perspective, and cross-sectional views provided herein. Said terminology is not intended to be limiting and includes the words specifically mentioned, derivatives therein, and words of similar import.

Figure 1A:
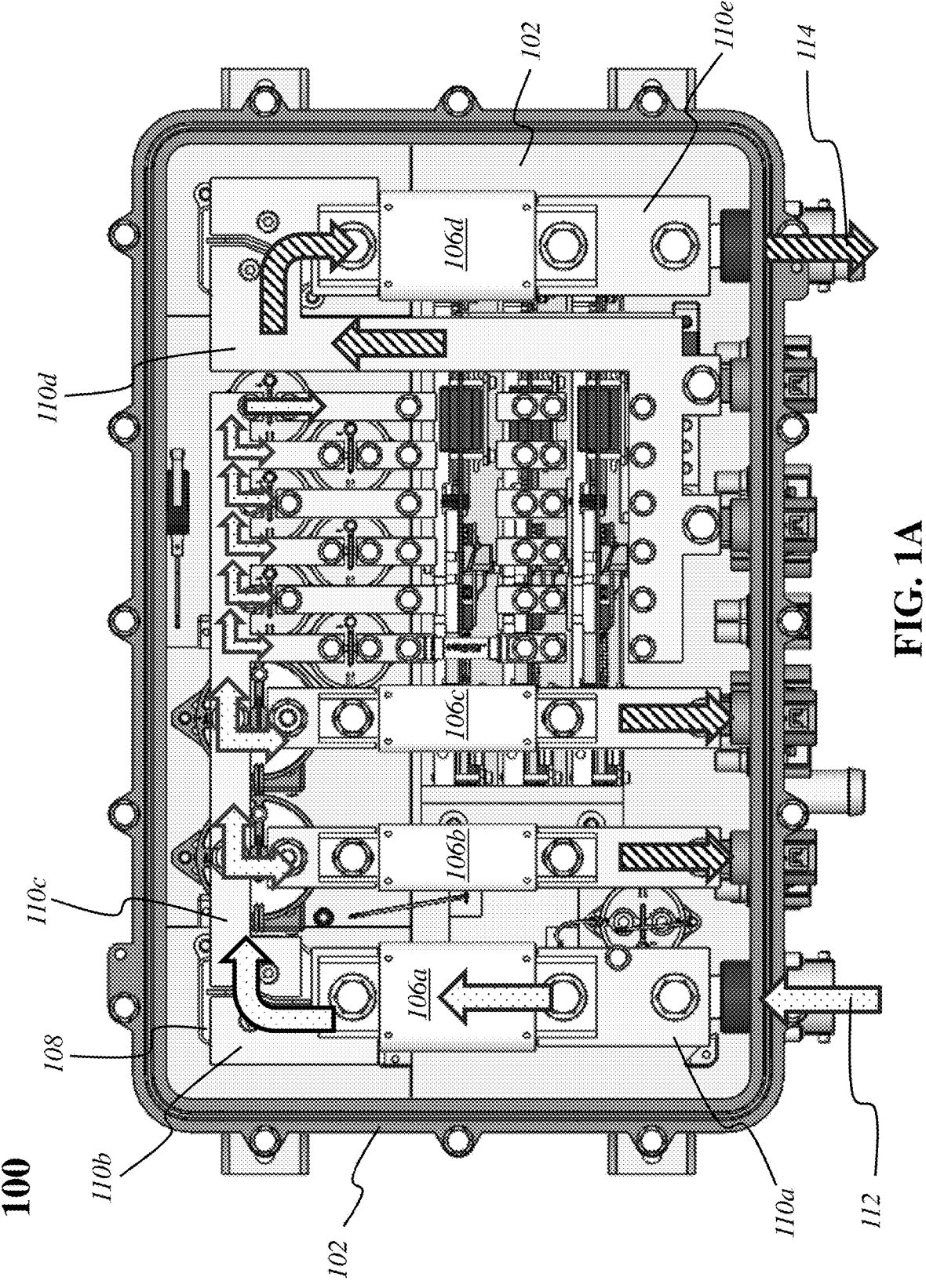
FIGS. 1A-1B are diagrams illustrating a PDU, in accordance with the prior art.
Figure 1B:
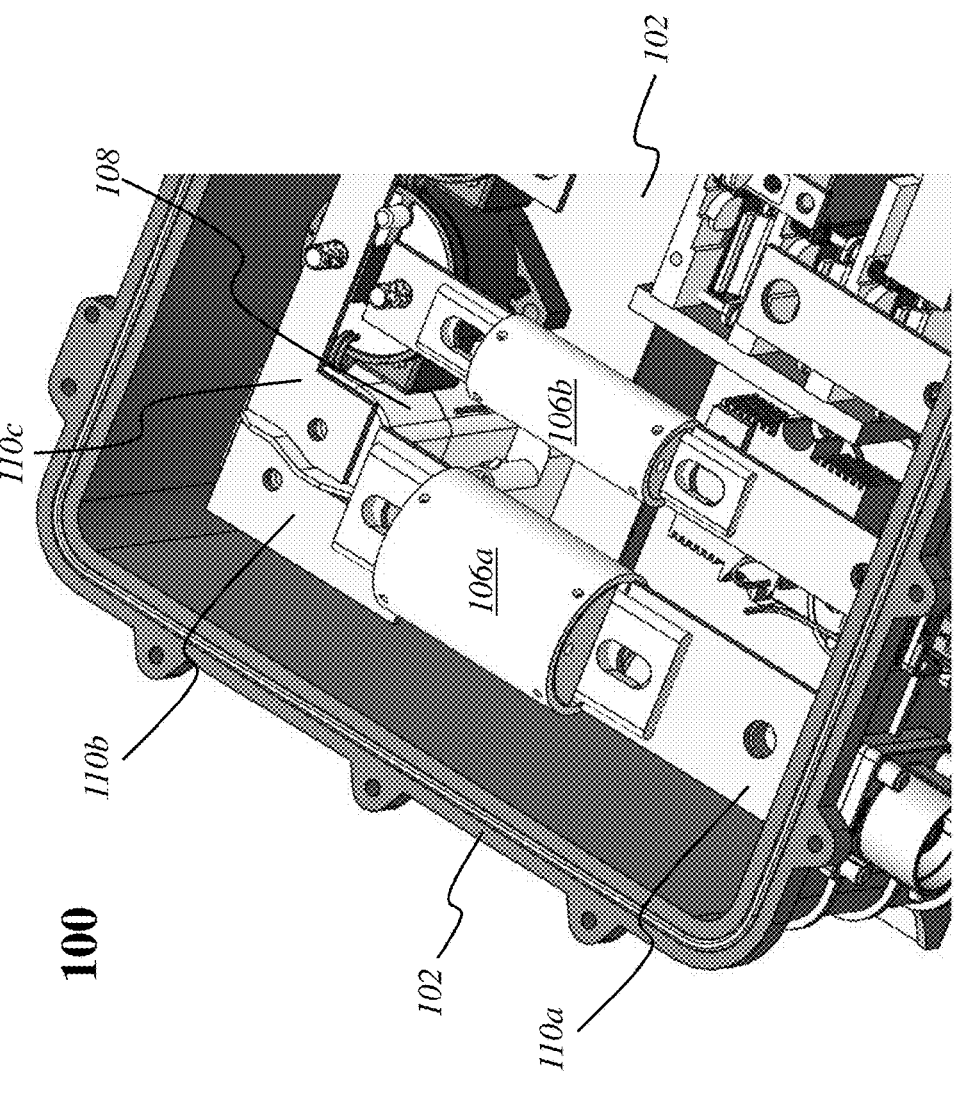

FIGS. 1A-1B are representative drawings of a power distribution unit (PDU) 100, according to the prior art. FIG. 1A is an overhead view of the PDU 100 and FIG. 1B is a perspective view of a portion of the PDU. The PDU 100 includes a housing 102 made of a metal such as aluminum. The PDU 100 features a matrix of copper bars and connections forming an electrical bus between devices. Multiple busbars are distributed throughout the PDU 100, with busbars 110*a*-110*e* called out in FIG. 1A and busbars 110*a*-110*c* called out in FIG. 1B (collectively, "busbars 110"). The PDU 100 houses multiple fuses and relays, with fuses 106*a*, 106*b*, 106*c*, and 106*d* being visible in FIG. 1A, and relay 108, visible in FIG. 1B, being beneath the busbars 110.

FIG. 1A includes power input arrows 112 (dotted) and power output arrows 114 (diagonal striped) to show the flow of current through the busbars 110 of the PDU 100. The power distribution may be uneven and some areas of the PDU 100 may heat up more than other areas. Due to the presence of high voltage and high current, some isolated busbars, for example, those between a fuse and a relay, are unable to dissipate the resulting heat. The housing 102 of the PDU 100 typically has a cover, so the resulting closed system may become quite hot. In addition to the thermal issue, the uneven heat distribution may impact the performance of fuses and relays within the PDU 100, possibly resulting in device failure.

Figure 2A:
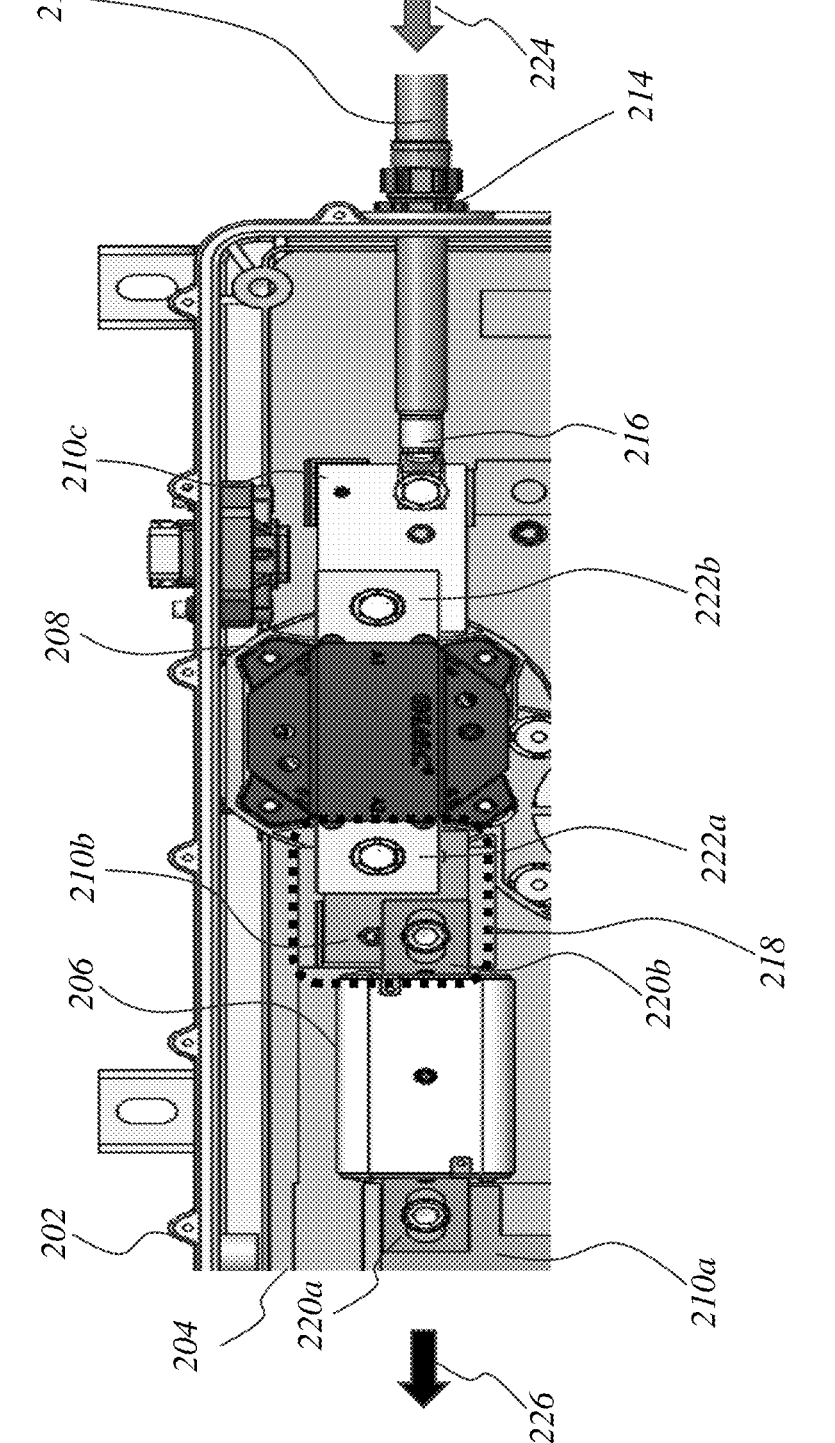
FIGS. 2A-2C are diagrams illustrating the PDU of FIGS. 1A-1B, in accordance with the prior art.
Figure 2B:
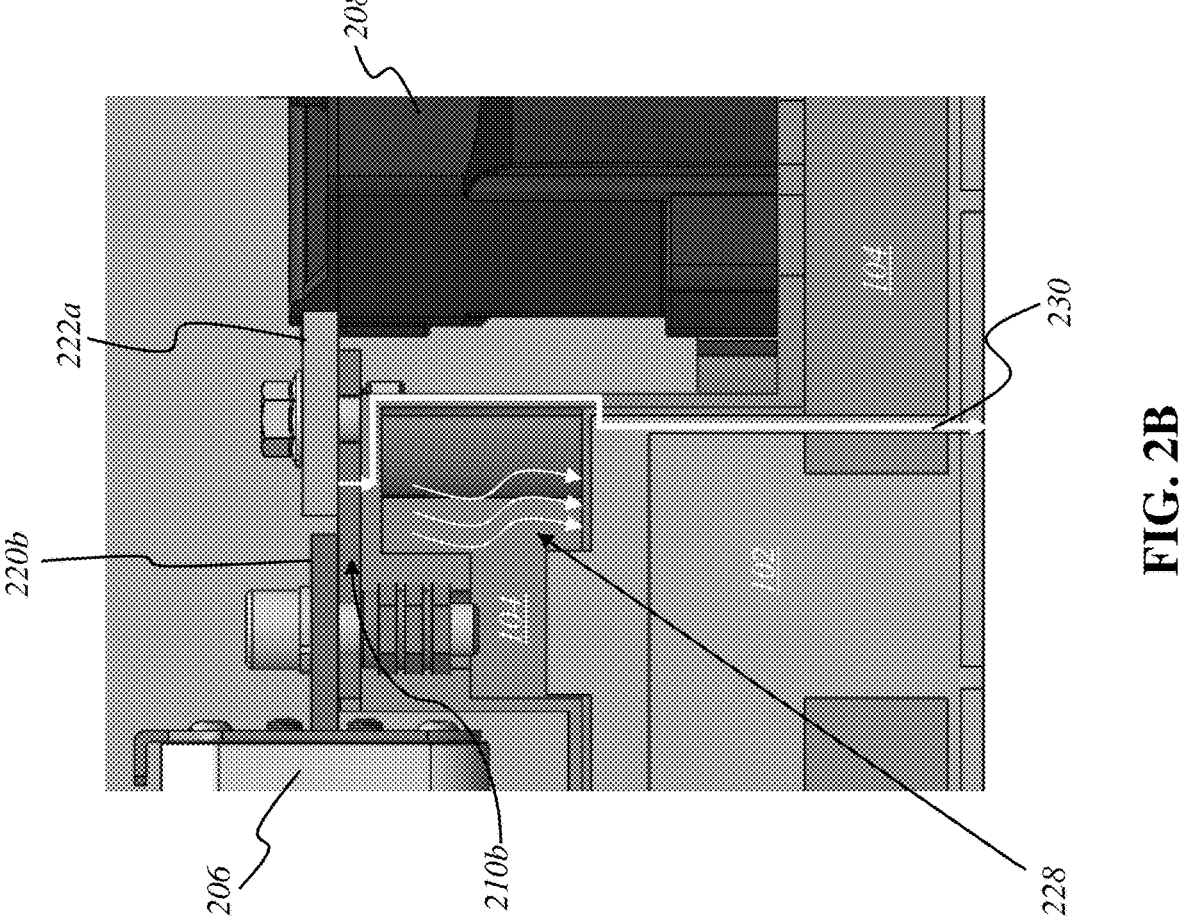
Figure 2C:
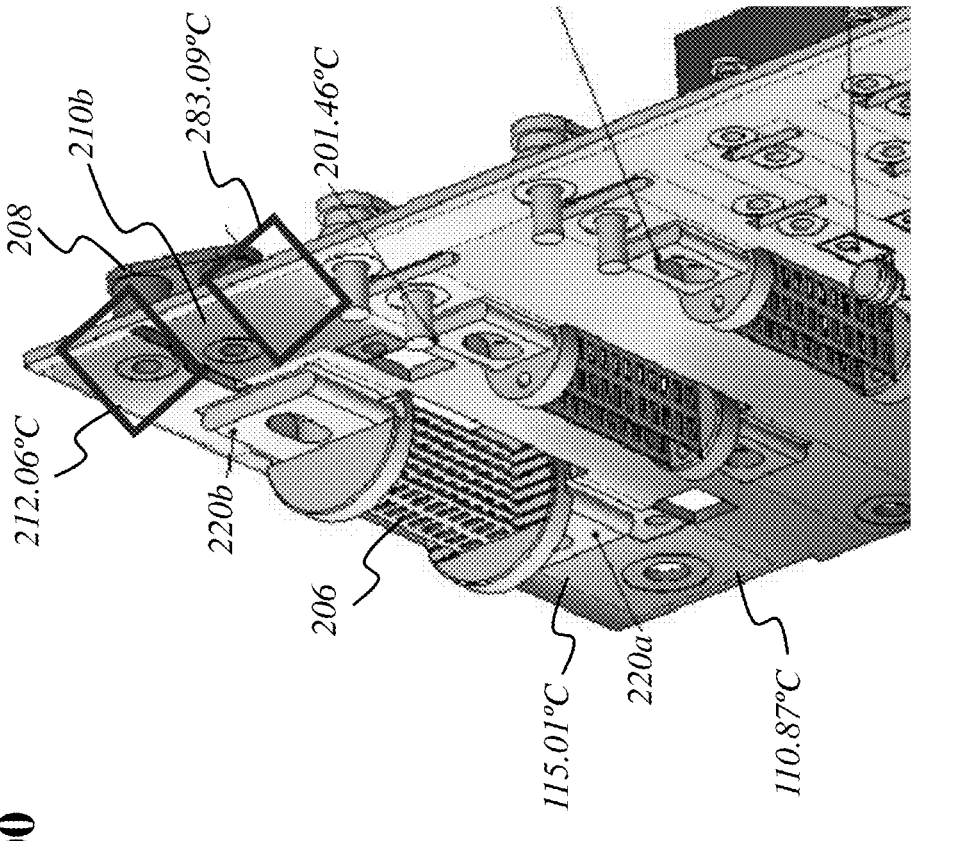

FIGS. 2A-2C are representative detailed drawings of a second PDU 200, according to the prior art. FIG. 2A is a detailed overhead view, FIG. 2B is a detailed side view, and FIG. 2C is a perspective view, of a portion of the PDU 200 featuring a fuse 206 and a relay 208. A housing 202 (aluminum) and a support grid 204 (plastic polymer) are also shown. A cable 212 is disposed through the housing 202, with a gland 214 to attach and secure the cable to the housing.

In FIG. 2A, busbars 210*a*, 210*b*, and 210*c* are shown, with busbar 210*a* connecting to terminal 220*a* of the fuse 206, busbar 210*b* connecting between terminal 220*b* of the fuse and terminal 222*a* of the relay 208, and busbar 210*c* connecting between the terminal 222*b* of the relay and a terminal 216 of the cable 212 (collectively, "busbars 210", "terminals 220" and "terminals 222"). Directional arrows 224 and 226 show that the current flows from the cable 212 to the busbar 210*c*, through the relay 208 to the busbar 210*b*, through the fuse 206 to the busbar 210*a*.

A thermal concentrated area 218, disposed between fuse 206 and the relay 208 at the busbar 210*b* is indicated with a dashed rounded square. Because of the proximity of the fuse 206 and the relay 208 to the busbar 210*b*, the busbar has difficulty quickly dissipating heat. As shown in FIG. 2B, the busbar 210*b* is supported by the support grid 204, with the housing 202 being beneath the support grid. As the busbar 210*b* heats up due to heat being generated by the connected fuse 206 and relay 208, heat travels downward through the support grid 204, as shown by heat dissipation indicators 228. The heat of the busbar 210*b* will travel downward, as indicated by the heat dissipation path 230, eventually reaching the aluminum material of the housing 202.

In FIG. 2C, a gradation of measured temperatures for the PDU 200 is shown, with the temperature at one end of the PDU being 110.87° C., the temperature at the terminal 220*a* of fuse 206 being 115.01° C., the temperature in a rectangular area between terminal 220*b* of fuse 206 and above relay 208 being 212.06° C., and the temperature in a second rectangular areal near terminal 220*b* and the relay 208 reaching 283.09° C. By contrast, the temperature of the fuse adjacent the fuse 206 near its terminal reaches 201.46° C. The illustration thus shows that, where there is an isolated busbar in the PDU 200, the temperature between a fuse and a relay, such as the fuse 206 and the relay 2108 with busbar 210*b* therebetween, can reach a high temperature relative to other areas of the PDU. Similar problems exist with an isolated busbar that connects between two fuses or two relays. The isolated busbar is unable to adequately dissipate heat.

Table 1 provides a comparison of the heat transfer coefficient between a non-exhaustive list of materials of the PDUs 100 and 200. The heat transfer coefficient is given in watts per meter Kelvin (W/mK). This is known as the "k" value, for thermal conductivity, which specifies the rate of heat transfer in any homogeneous material. If a material has a k value of 1, it means a 1 m cube of material will transfer heat at a rate of one watt for every degree of temperature difference between opposite faces of the cube. The lower the k value, the less heat the material will transfer. The materials in Table 1 show a comparison between highly conductive materials, such as aluminum, versus poorly conductive materials, such as plastic and air, and are not meant to limit the materials that may be used in the PDU 300 and heat dissipation bolt 400 shown and described below.

TABLE 1

| Heat Transfer Coefficient (Conductivity) of various materials | |
| --- | --- |
| Material | W/mK |
| Plastic | 0.27 |
| Aluminum | 237 |

4

TABLE 1-continued

| Heat Transfer Coefficient (Conductivity) of various materials | |
| --- | --- |
| Material | W/mK |
| Air | 0.027 |
| Ceramic | 270 |
| Steel | 50 |

As shown in Table 1, plastic and air have very low heat transfer coefficients as compared to aluminum and ceramic. Steel has a heat transfer coefficient that is lower than aluminum, but higher than plastic and air. FIG. 2B illustrates that the heat generated by the busbar 210*b* travels through the plastic material of the support grid 204 before reaching the aluminum material of the housing 202.

The heat that is to be dissipated by the PDU 100 or the PDU 200 may include radiation heat, conduction heat, or convection (air) heat. Because the PDUs 100/200 are closed systems with a cover, the contents of the PDU may become quite hot which, in turn, may cause the components inside the PDU to fail. Particularly at the junction points where there is an isolated busbar between two heat generating components, as the busbars 110*b*/210*b* between respective fuses 106/206 and respective relays 108/208, there is a need for the heat generated within the PDUs 100/200 to be dissipated.

Figure 3A:
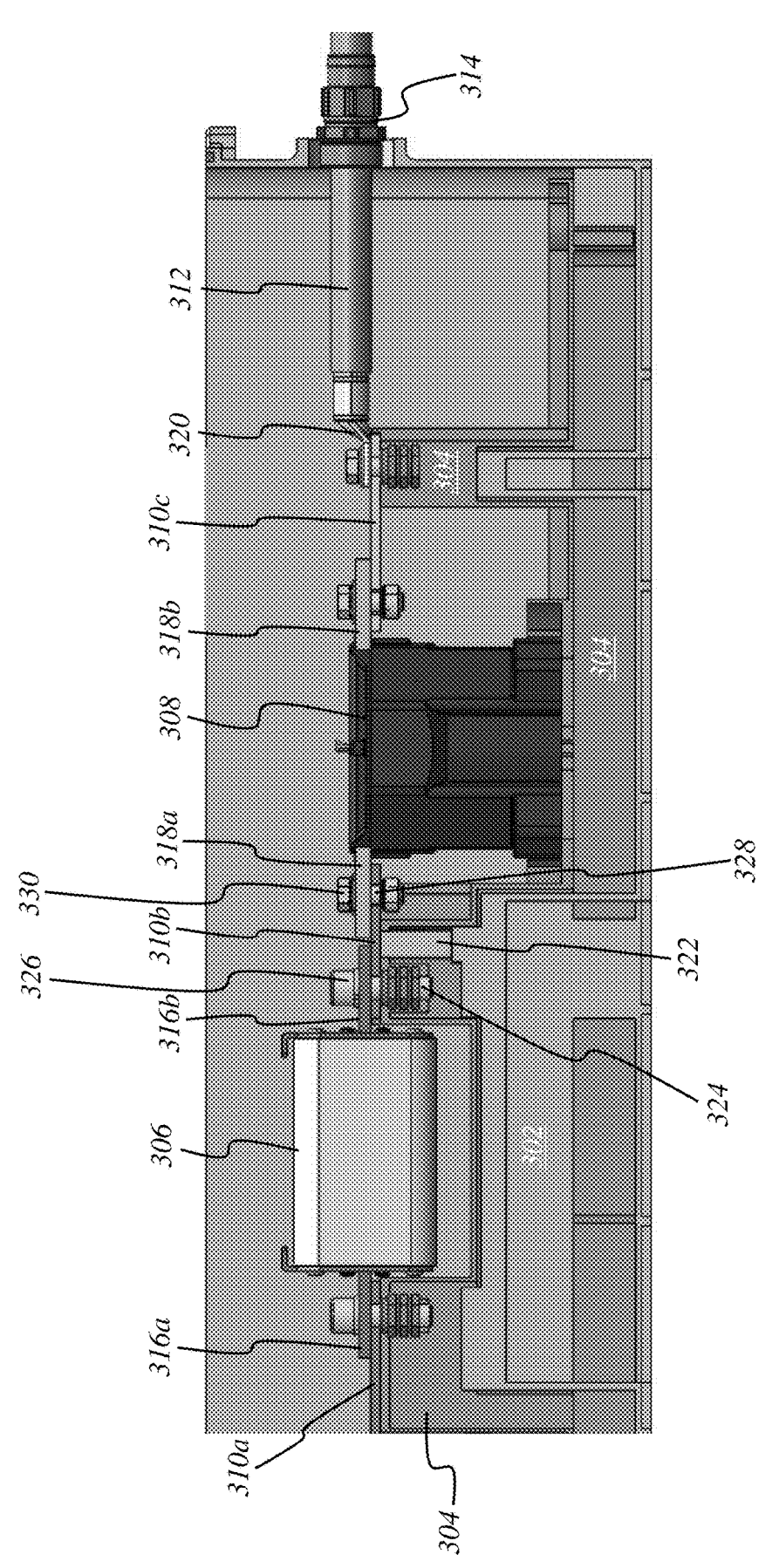
FIG. 3 is a diagram illustrating a PDU adapted to support a heat dissipation bolt, in accordance with exemplary embodiments.
Figure 3B:
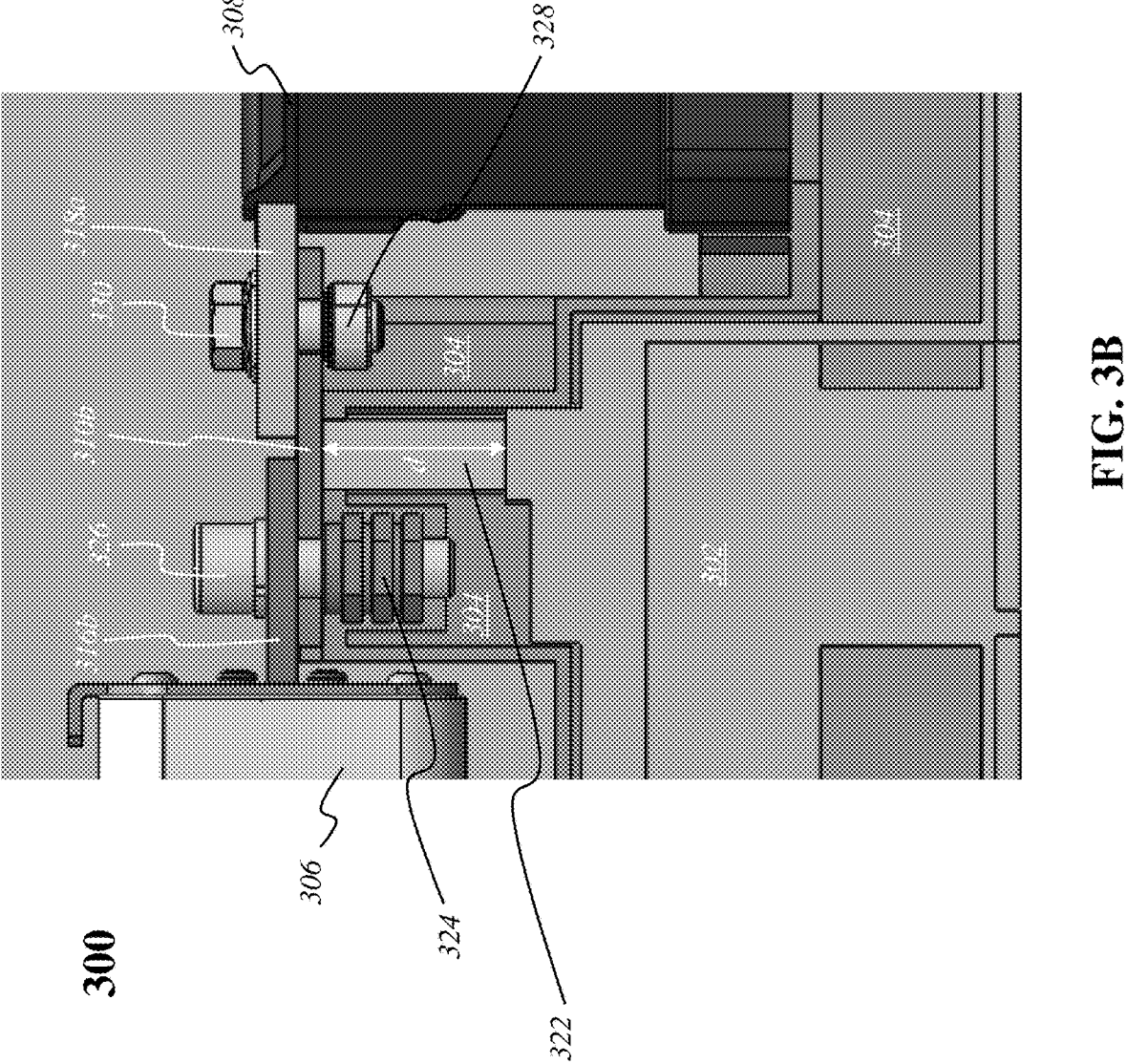

FIGS. 3A-3B are representative drawings of a PDU 300 that has been adapted to support a heat dissipation bolt, according to exemplary embodiments. FIG. 3A is a side view of the PDU 300 and FIG. 3B is a detailed view of the portion of the PDU between a fuse and a relay. The PDU 300 includes a housing 302 with a support grid 304. The housing 302 is made of a metal such as aluminum while the support grid 304 is made of a plastic polymer. As with the prior art PDU 100, the PDU 300 features a matrix of copper bars and connections forming an electrical bus between devices. Multiple busbars are distributed throughout the PDU 300, with busbars 310*a*, 310*b*, and 310*c* called out in FIG. 3A, with busbar 310*b* also shown in FIG. 3B (collectively, "busbars 310"). The busbar 310*b* is disposed between fuse 306 and relay 308.

The fuse 306 is connected between busbar 310*a* and busbar 310*b* by respective terminals 316*a* and 316*b* (collectively, "terminals 316"). Similarly, the relay 308 is connected between busbar 310*b* and busbar 310*c* by respective terminals 318*a* and 318*b* (collectively, "terminals 318"). The busbar 310*c* is connected at its other end to terminal 320 of a cable 312, which is disposed through the housing 302 of the PDU 300 and secured by a gland 314. Terminal 316*b* of fuse 306 is secured to busbar 310*b* by a bolt 324 and a nut 326. Terminal 318*a* of relay 308 is secured to busbar 310*b* by a bolt 328 and a nut 330.

Due to the presence of high voltage and high current, the isolated busbar 310*b*, being between the heat-generating fuse 306 and relay 308, becomes hot. The housing 302 of the PDU 300 typically has a cover, so the resulting closed system may become quite hot, particularly at the location of the busbar 310*b*. A heat dissipation bolt location 322 is shown disposed below the busbar 310*b*, adjacent the bolt 324 (of terminal 316*b*) and adjacent the bolt 328 (of terminal 318*a*). the heat dissipation bolt location 322 is thus disposed between bolt 324 and bolt 328. The heat dissipation bolt location 322 will replace some of the plastic polymer of the support grid 304 of the housing 302. Thus, while the support grid 304 continues to provide support to the busbars 310, the heat dissipation bolt will also be able to provide support.

The heat dissipation bolt location 322 shows a distance d between the busbar 310b and the aluminum housing 302. The distance d indicates the creepage and clearance requirements of the PDU at that location. Creepage is defined as the shortest distance between two conductive paths measured along the surface of a solid insulation. The distance d is thus the distance heat, whether radiation heat, conduction heat, or convection air heat will travel with the heat dissipation bolt. In comparison, the heat dissipation path 230 in FIG. 2B is significantly longer to reach the aluminum housing.

Figure 4B:
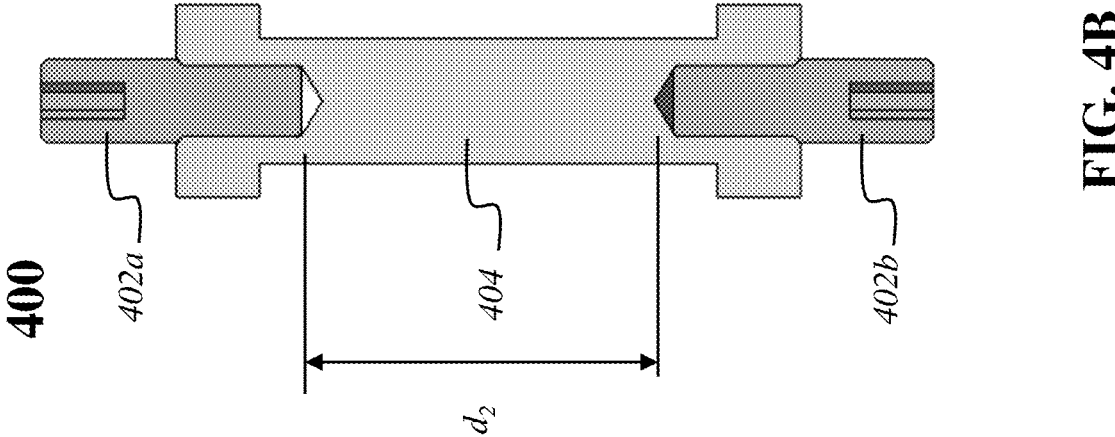
FIGS. 4A-4B are diagrams illustrating a heat dissipation bolt, in accordance with exemplary embodiments.
Figure 4A:
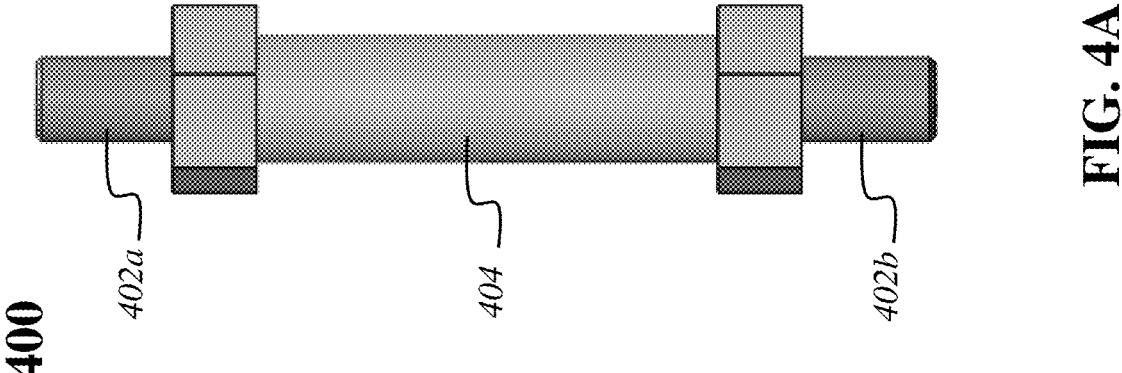

FIGS. 4A-4B are representative drawings of a heat dissipation bolt 400 to be inserted in the heat dissipation bolt location 322 of the PDU 300 of FIGS. 3A-3B, according to exemplary embodiments. FIG. 4A is a side view of the heat dissipation bolt 400 and FIG. 4B is a cross-sectional view of the heat dissipation bolt. The heat dissipation bolt 400 features two bolts 402a and 402b disposed between a body 404 (collectively, "bolts 402"). The bolt 402a is disposed at one end of the body 404 while the other bolt 402b is disposed at a second, opposite end of the body. In exemplary embodiments, the bolts 402 are made of steel while the body is made of non-conductive ceramic. In some embodiments, the bolts 402 are threaded. The body 404 may instead be made of other non-conductive materials.

In exemplary embodiments, a hole is bored through both the busbar 310b, a second hole is bored through the plastic polymer of the support grid 304 at the location of the heat dissipation bolt location 322, and a third hole is bored through the aluminum housing 302, also at the location of the heat dissipation bolt location (FIGS. 3A-3B). In exemplary embodiments, the holes through the busbar 30 and the aluminum housing 302 are threaded. The bolt 402a is rotationally inserted through the busbar 310 while the bolt 402b is rotationally inserted through the housing 302. In exemplary embodiments, the heat dissipation bolt 400 is orthogonal to the busbar 310b once installed. In exemplary embodiments, the ceramic body 404 is a size, d, in length, just as the heat dissipation bolt location 322 is a length, d, to satisfy the creepage and clearance preferences of the PDU 300.

The body 404 of the heat dissipation bolt 400 is made of a non-conductive, insulating material, such as insulating ceramic. A distance $d_2$ between the bolt 402a and the bolt 402b ensures a path for the heat to transfer from the busbar 310b to the housing 302, but also ensures that the current will continue to flow through the busbar and will be blocked at the body 404 of the heat dissipation bolt 400 from forming another current path.

Figure 5:
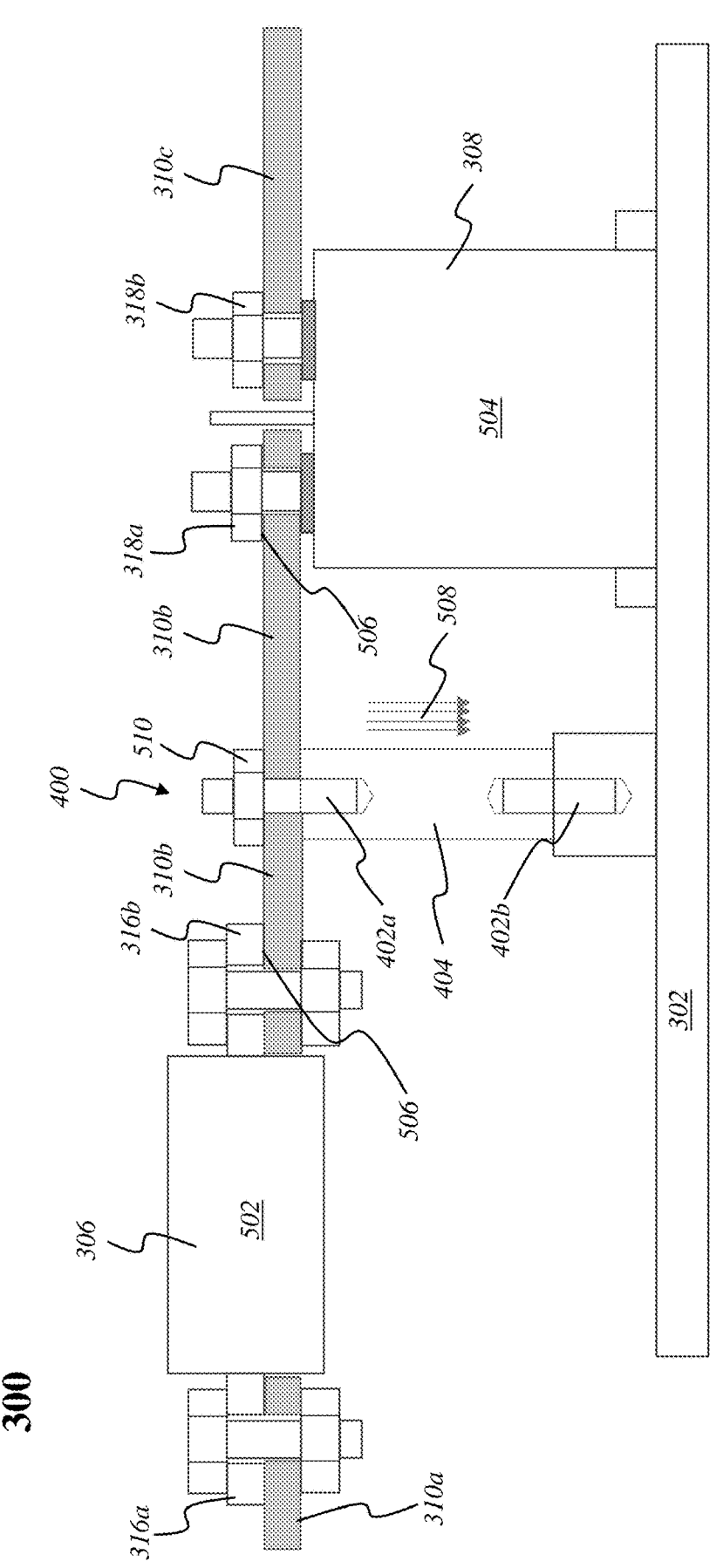
FIG. 5 is a diagram illustrating a PDU with the heat dissipation bolt of FIGS. 4A-4B, in accordance with exemplary embodiments.

FIG. 5 is a representative drawing of the PDU 300 of FIGS. 3A-3B, this time featuring the heat dissipation bolt 400 of FIGS. 4A-4B, according to exemplary embodiments. A hole, which is threaded in exemplary embodiments, is drilled in the isolated busbar 310b for receiving the bolt 402a. A second hole, also threaded in exemplary embodiments, is drilled through the housing 302 for receiving the bolt 402b. The heat dissipation bolt 400 further is disposed within the region of the support grid 304. In one embodiment, a portion of the support grid 304 is removed at the heat dissipation bolt location 322 (FIGS. 3A-3B) to seat the heat dissipation bolt 400. In another embodiment, a hole is drilled into the support grid 304 of a size sufficient to insert the heat dissipation bolt 400. In another embodiment, the support grid is redesigned so that an opening is available to allow the heat dissipation bolt 400 to be inserted between the isolated busbar 310b and the housing 302. A nut 510 is used to secure the heat dissipation bolt 400 to the busbar 310b.

Contact area heat 502 is shown inside the fuse 306. Similarly, contact area heat 504 is shown inside the relay 308. The contact area heat 502 and 504, as well as the high current passing through the busbars, cause the isolated busbar 310b to get hot. Further, contact resistance heat 506 occurs where the terminals are touching the isolated busbar 310b. Contact resistance heat 506 is shown between the terminal 316b of fuse 306 and the busbar 310b. Contact resistance heat 506 is also shown between the terminal 318a of relay 308 and the busbar 310b. In exemplary embodiments, the heat dissipation bolt 400 provides a mechanism for dissipating both contact area heat and contact resistance heat, given by heat dissipation arrows 508. The heat that is transferred is both radiation heat and conduction heat. The heat dissipation arrows 508 point away from the busbar 310b to indicate that both radiation heat and conduction heat travel away from the busbar and toward the housing 302.

The heat dissipation bolt 400 is made of a combination of steel and ceramic, both of which have high heat transfer coefficients as compared to the plastic of the support grid 304 as well as any air inside the PDU 300. Thus, in exemplary embodiments, the heat dissipation bolt 400 quickly transfers heat away from the busbar 310b. In some embodiments, the bolts 402 are covered with an insulated material. However, the insulating material of the ceramic body 404 is sufficient to prevent the flow of current through the heat dissipation bolt 400.

The plastic polymer support grid 304 of the PDU 300 provides support to the busbar 310b. In exemplary embodiments, the heat dissipation bolt 400 also provides support to the busbar 310b. Thus, the heat dissipation bolt 400 provides both a mechanism by which heat is quickly dissipated from the busbar 310b to the aluminum housing 302 and further provides physical support to the busbar.

The heat dissipation bolt thus provides a mechanism by which heat is efficiently moved from the isolated busbar between two heat-producing devices within a PDU. This keeps the temperature inside the PDU more uniform and mitigates the possibility that one or both heat-producing devices will fail. The insulated body of the heat dissipation bolt prevents current from traveling down the heat dissipation bolt to the housing of the PDU. The heat dissipation bolt further provides physical support to the isolated busbar and may result in a smaller support grid 304 within the PDU As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:
1. A power distribution unit comprising:
a fuse comprising a first terminal;
a relay comprising a second terminal; and
a busbar disposed between the fuse and the relay, wherein the busbar is connected to the first terminal and the second terminal; and a heat dissipation bolt coupling the busbar to a housing of the power distribution unit, the heat dissipation bolt comprising a first bolt disposed through the busbar, a second bolt disposed through the housing, and a ceramic body disposed between the first bolt and the second bolt.

2. The power distribution unit of claim 1, wherein the first bolt and the second bolt are steel.

3. The power distribution unit of claim 1, wherein the first bolt and the second bolt are threaded.

4. The power distribution unit of claim 1, wherein the heat dissipation bolt is orthogonal to the busbar.

5. The power distribution unit of claim 1, wherein the ceramic is non-conductive.

6. The power distribution unit of claim 1, wherein the busbar is part of an electrical bus comprising a plurality of busbars.

7. The power distribution unit of claim 1, further comprising a support grid, wherein the heat dissipation bolt is disposed within the support grid.

8. The power distribution unit of claim 7, wherein the support grid is a plastic polymer.

9. A power distribution unit, comprising:

a housing;

a fuse disposed within the housing, the fuse comprising a first terminal and a second terminal;

a relay disposed within the housing, the relay comprising a third terminal and a fourth terminal;

an electrical bus comprising:
   a first busbar connected to the first terminal;
   a second busbar connected between the second terminal and the third terminal; and
   a third busbar connected to the fourth terminal; and
a support grid disposed within the housing, the support grid to provide physical support to the fuse, the relay, and the electrical bus; and
a heat dissipation bolt comprising a first bolt, a second bolt, and a body, wherein the heat dissipation bolt is bolted orthogonal to the second busbar.

10. The power distribution unit of claim 9, wherein current flows through the first busbar, the first terminal, the fuse, the second terminal, the second busbar, the third terminal, the relay, and the fourth terminal.

11. The power distribution unit of claim 9, wherein the first bolt and the second bolt are threaded.

12. The power distribution unit of claim 11, wherein the first bolt and the second bolt are steel.

13. The power distribution unit of claim 9, wherein the body is ceramic.

14. The power distribution unit of claim 9, wherein the body is non-conductive.

15. The power distribution unit of claim 9, wherein the body prevents current from flowing from the second busbar to the housing.

16. The power distribution unit of claim 9, wherein the body is disposed within the support grid.

17. The power distribution unit of claim 9, wherein the support grid is plastic polymer.

18. The power distribution unit of claim 9, wherein the housing is aluminum.

* * * * *